(12) United States Patent
Chen et al.

(10) Patent No.: US 8,211,807 B2
(45) Date of Patent: Jul. 3, 2012

(54) DOUBLE PATTERNING TECHNOLOGY USING SINGLE-PATTERNING-SPACER-TECHNIQUE

(75) Inventors: Huang-Yu Chen, Zhudong Township (TW); Ken-Hsien Hsieh, Taipei (TW); Tsong-Hua Ou, Taipei (TW); Fang-Yu Fan, Hukou Township (TW); Yuan-Te Hou, Hsin-Chu (TW); Ming-Feng Shieh, Yongkang (TW); Ru-Gun Liu, Hsin-Chu (TW); Lee-Chung Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/907,640

(22) Filed: Oct. 19, 2010

(65) Prior Publication Data

US 2012/0091592 A1    Apr. 19, 2012

(51) Int. Cl.
*H01L 21/461* (2006.01)
*H01L 21/302* (2006.01)
(52) U.S. Cl. ........ 438/717; 438/623; 438/725; 430/311; 257/E21.257
(58) Field of Classification Search .................. 438/623, 438/717, 725; 430/311
See application file for complete search history.

(56) References Cited

U.S. PATENT DOCUMENTS

| | | | |
|---|---|---|---|
| 6,492,073 B1 * | 12/2002 | Lin et al. .......................... | 430/5 |
| 7,651,950 B2 | 1/2010 | Ban | |
| 2006/0177773 A1 * | 8/2006 | Hennig et al. ................ | 430/311 |
| 2008/0268381 A1 * | 10/2008 | Saito et al. ..................... | 430/323 |
| 2009/0253078 A1 * | 10/2009 | Bekiaris et al. ............... | 430/312 |
| 2010/0033698 A1 * | 2/2010 | Sewell ............................. | 355/53 |
| 2010/0040957 A1 * | 2/2010 | Hiraki et al. ...................... | 430/5 |
| 2010/0196803 A1 * | 8/2010 | Lu et al. .......................... | 430/5 |
| 2010/0306727 A1 * | 12/2010 | Itagaki ............................ | 716/10 |
| 2010/0323292 A1 * | 12/2010 | Nakamura et al. ......... | 430/270.1 |
| 2011/0003254 A1 * | 1/2011 | Chang et al. .................. | 430/322 |
| 2011/0014786 A1 * | 1/2011 | Sezginer et al. .............. | 438/618 |
| 2011/0121366 A1 * | 5/2011 | Or-Bach et al. ............... | 257/204 |
| 2011/0296360 A1 * | 12/2011 | Wang et al. .................... | 716/106 |

OTHER PUBLICATIONS

Bencher, C. et al., "22nm Half-Pitch Patterning by CVD Spacer Self Alignment Double Patterning (SADP)", SPIE, 2008, vol. 6924, 69244E, 7 pgs.

* cited by examiner

*Primary Examiner* — Alexander Ghyka
(74) *Attorney, Agent, or Firm* — Slater & Matsil, L.L.P.

(57) ABSTRACT

A method of forming an integrated circuit structure includes forming a first and a second plurality of tracks parallel to a first direction and on a wafer representation. The first and the second plurality of tracks are allocated in an alternating pattern. A first plurality of patterns is laid out on the first plurality of tracks and not on the second plurality of tracks. A second plurality of patterns is laid out on the second plurality of tracks and not on the first plurality of tracks. The first plurality of patterns is extended in the first direction and in a second direction perpendicular to the first direction, so that each of the second plurality of patterns is surrounded by portions of the first plurality of patterns, and substantially none of neighboring ones of the first plurality of patterns on the wafer representation have spacings greater than a pre-determined spacing.

10 Claims, 12 Drawing Sheets

DOUBLE PATTERNING TECHNOLOGY USING SINGLE-PATTERNING-SPACER-TECHNIQUE

BACKGROUND

Double patterning is a technology developed for lithography to enhance feature density in integrated circuits. Typically, for forming features of integrated circuits on wafers, lithography technology is used, which involves applying a photo resist, and defining patterns in the photo resist. The patterns in the photo resist are first defined in a lithography mask, and are implemented either by the transparent portions or by the opaque portions in the lithography mask. The patterns in the patterned photo resist are then transferred to the manufactured features, which are formed on a wafer.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The closely located features are separated to two masks of a same double-patterning mask set, with both masks used to form features that would have been formed using a single mask. In each of the masks, the distances between the features are increased over the distances between the features in the otherwise a single mask, and hence the optical proximity effect is reduced, or substantially eliminated.

Conventional double patterning technologies require two photo lithography processes. In some conventional double patterning processes, the patterns in a first lithography mask of a double-patterning mask set is transferred to a sacrificial layer, which may be a hard mask layer, using a first photo lithography process. The patterns in a second lithography mask of the same double-patterning mask set are then transferred to the sacrificial layer using a second photo lithography process. The patterns in the sacrificial layer are then used to form the desirable features.

In other conventional double patterning processes, the patterns in a first lithography mask of a double-patterning mask set is transferred to a first photo resist. The patterned first photo resist is then protected (referred to as litho-freeze). The patterns in a second lithography mask of the same double-patterning mask set is then transferred to a second photo resist at a same level as the first photo resist. The patterns of the first and the second photo resists are then transferred to form desirable features.

In yet other conventional double patterning processes, sacrificial patterns are first formed, and then spacers are formed on the sidewalls of the sacrificial patterns. The sacrificial patterns are then removed, leaving the spacers. As a result, the pattern density of the spacers is doubled over that of the sacrificial patterns, and the pitch of the spacers is reduced to a half of that of the sacrificial patterns. A separate lithography process is then performed to pattern the spacers. The patterns of the spacers may then be transferred to form desirable features.

In the conventional double patterning processes, two lithography steps are needed. Due to the mask misalignment between the two lithography steps, the relative positions of features formed using the first and the second lithography masks may deviate relative to each other. This will impact the RC and the timing behavior of the resulting circuits.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 7B are cross-sectional views and top views of intermediate stages in the manufacturing of double patterning features in accordance with an embodiment;

FIGS. 8A through 10 illustrate double patterning features in accordance with alternative embodiments;

FIGS. 12A through 15 illustrate the formation of double patterning features in accordance with various alternative embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel double patterning process is presented in accordance with an embodiment. The intermediate stages of manufacturing the embodiment are illustrated. The variations of the embodiment are then discussed. Throughout the various views and illustrative embodiments, like reference numbers are used to designate like elements.

Figure 1:
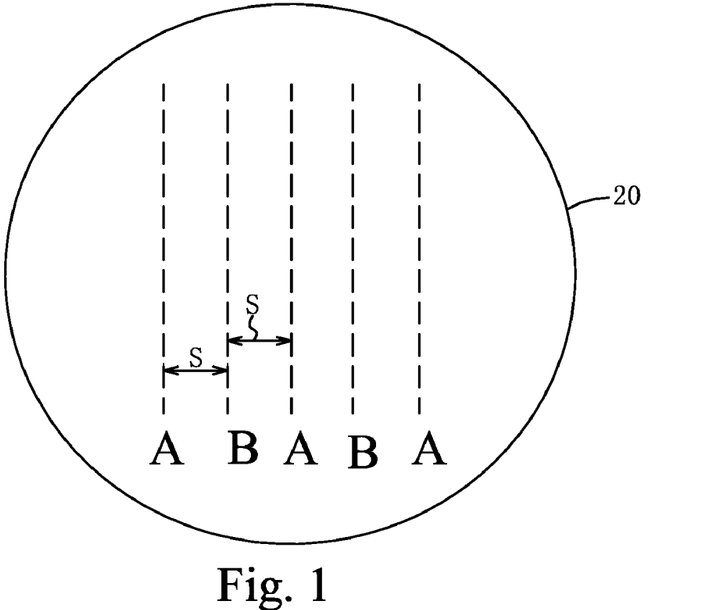
Figure 2:
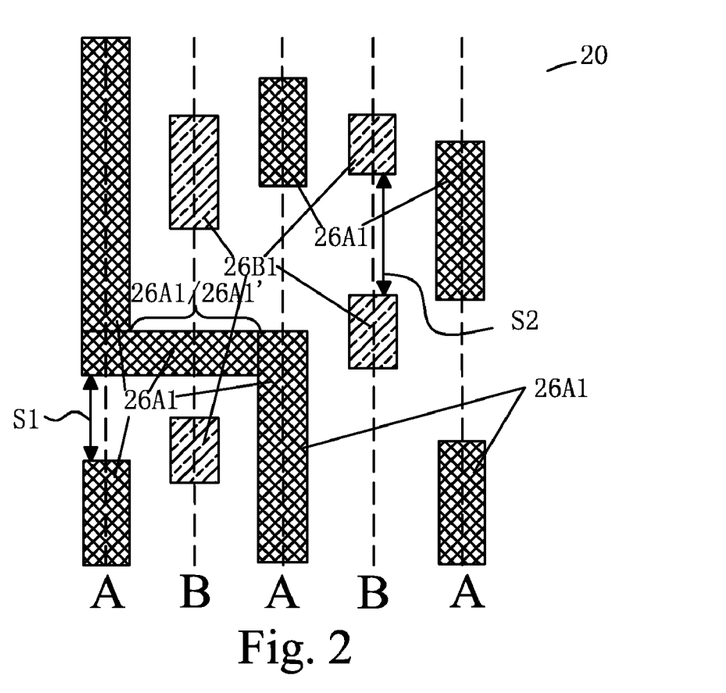
Figure 3:
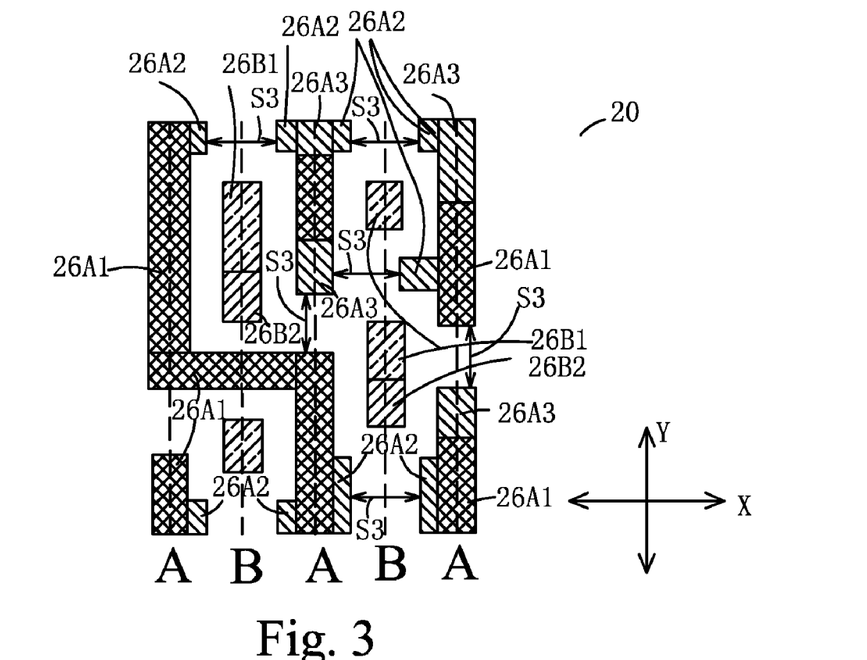

FIGS. 1 through 7B illustrate the formation of double patterning features on a semiconductor wafer using a double patterning technology in accordance with an embodiment. FIGS. 1 through 3 illustrate the formation of layouts of the double patterning features. Referring to FIG. 1, a top view of wafer representation 20 is provided. Wafer representation 20 is drawn in a layout tool, which may be a computer including a storage media such as a hard drive. Wafer representation 20 represents the actual wafer on which the double patterning features will be manufactured. Tracks (referred to as "A" tracks and "B" tracks hereinafter) are drawn in wafer representation 20, and are allocated in an alternating pattern. In an embodiment, A-tracks and B-tracks are drawn throughout wafer representation 20 and chip representations (not shown) in wafer representation 20, although they may be drawn in a region of wafer representation 20 in which double patterning patterns are to be formed, but not in the regions in which no double patterning features are to be formed. A-tracks and B-tracks may have uniform spacing S, although the spacing may also be non-uniform.

Next, patterns 26A1 (also referred to as A-patterns throughout the disclosure) and 26B1 (also referred to as B-patterns throughout the disclosure) of a same layer, and a same type, of integrated circuits are laid out in wafer representation 20, as shown in FIG. 2. Patterns 26A1 and 26B1 may be active regions, patterns of metal lines (or vias or contact plugs) in a metal layer, polysilicon lines in a polysilicon layer, or patterns in any other layer of integrated circuits. Patterns 26A1 are laid out on, and aligned to, the A-tracks, while patterns 26B1 are laid out on, and aligned to, the B-tracks. Accordingly, patterns 26A1 are also referred to as A-patterns, while patterns 26B1 are referred to as B-patterns. When patterns 26A1 and 26B1 are the patterns of metal lines and/or vias, the respective layout may be performed by a routing tool, and hence the respective layout step is also a routing step. In an embodiment, the layout is one-dimensional (1D), which means that no jog connects patterns 26A1 on different A-tracks, and no jog connects patterns 26B1 on different B-tracks. In alternative embodiments, the layout is two-dimensional (2D), which means that there are jogs (such as jog 26A1') connecting patterns 26A1 on different A-tracks, and/or jogs (not shown) connecting patterns 26B1 on different B-tracks. In an embodiment, the jogs connecting patterns 26A1 is allowed, and jogs connecting patterns 26B1 is allowed, while no jog connecting any one of patterns 26A1 to any one of patterns 26B1 is laid out.

The minimum (allowable) spacing S1 between neighboring patterns 26A1 may be different from the minimum spacing S2 between neighboring patterns 26B1. In an embodiment, minimum spacing S2 is greater than about 1.5 times, 2 times, or 3 times minimum spacing S1.

Referring to FIG. 3, patterns 26A1 and 26B1 are extended in X directions and/or Y directions, so that dummy fills 26A2 and 26B2 are added to the layout as shown in FIG. 2. Dummy fills include portions 26A2 that are extended in the X directions, and portions 26A3 and 26B2 that are extended in the Y directions. After the pattern extension, patterns 26A2 and 26A3 may be connected to the respective pattern 26A1 to form integrated patterns (referred to as patterns 26A hereinafter), which, although illustrated using different shadings, are actually not distinguishable from patterns 26A1. Similarly, patterns 26B2 may be connected to the respective pattern 26B1 to form integrated patterns (referred to as patterns 26B hereinafter).

Figure 6A:
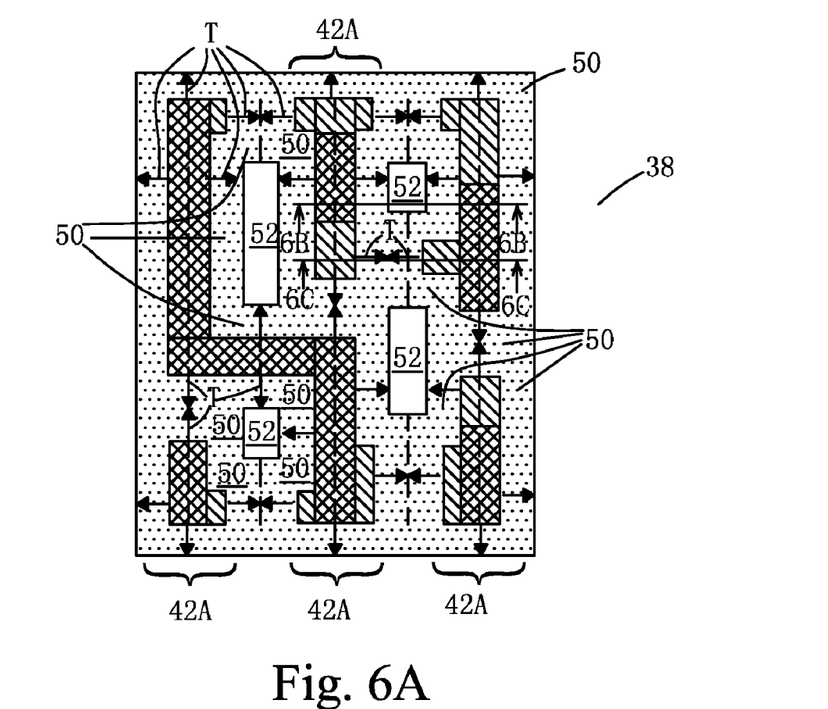
Figure 6B:
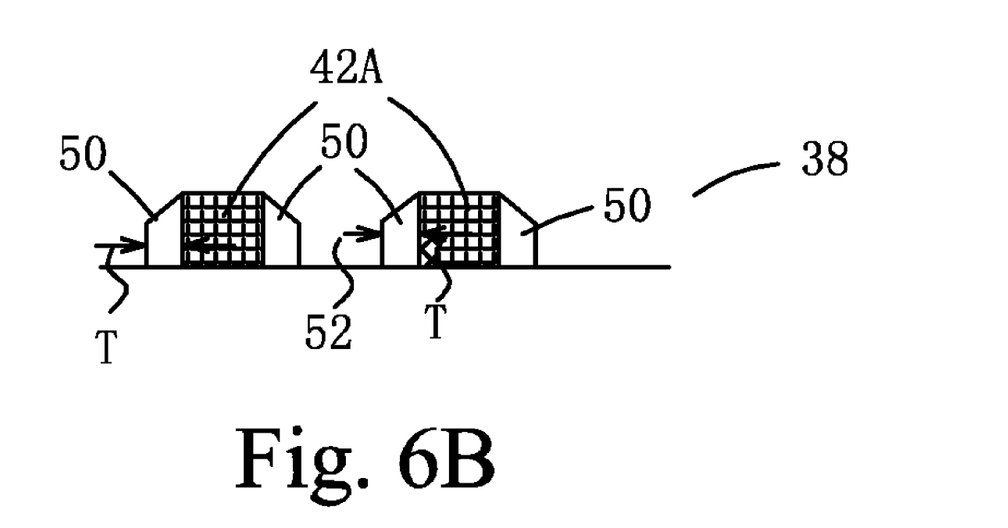

After the pattern extension, each of the patterns 26B (including 26B1 and 26B2) is surrounded by one or more patterns 26A (including 26A1, 26A2, and 26A3). Further, spacings S3 between neighboring patterns 26A that surround a same pattern 26B are smaller than or equal to a pre-determined spacing, which, as will be equal to or less than two times thickness T of spacers 50, as shown in FIG. 6B.

Figure 4A:
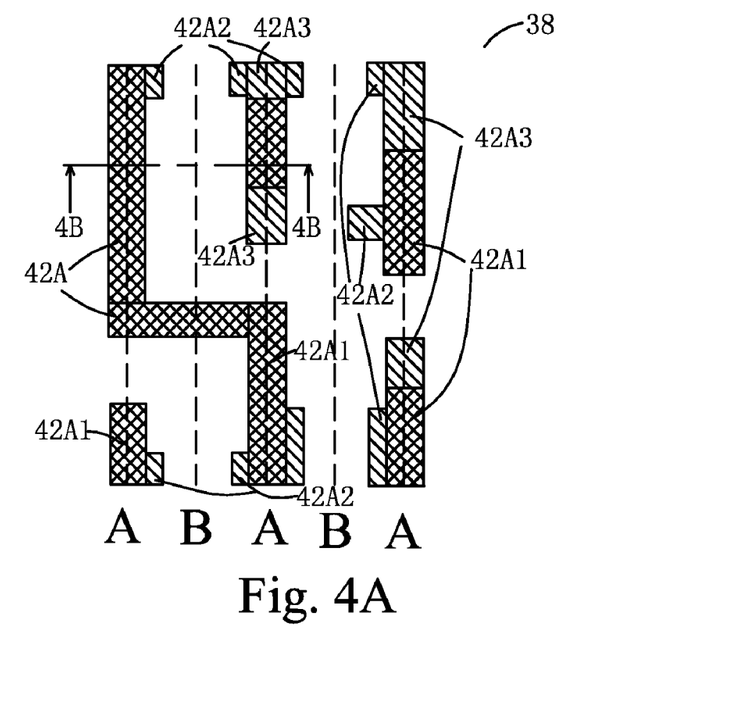
Figure 4B:
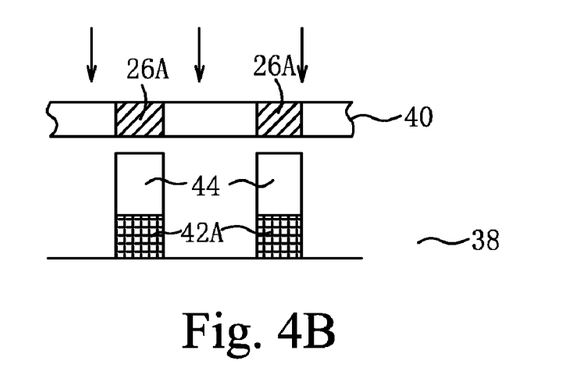

Patterns 26A as shown in FIG. 3 may then be formed on lithography mask 40 as shown in FIG. 4B, wherein lithography mask 40 includes transparent portions allowing light (used for the exposure of photo resist 44) to pass through, and opaque portions for blocking the light. Patterns 26B, however, are not included in lithography mask 40. In FIG. 4A, which is a top view of wafer 38, lithography mask 40 is used to form features 42A, which have the same patter as patterns 26A in FIG. 3, over wafer 38. Although features 42A are shown as having dummy fills 42A2 and 42A3 that are illustrated using different shading as that of 42A1, the dummy fills are actually integrated parts of features 42A, and cannot be distinguished from other parts of features 42A. Features 42A may be metal lines, polysilicon lines, insulation lines/regions, active regions, or any other features in any layer of the integrate circuits.

FIG. 4B illustrates a cross-sectional view of the structure shown in FIG. 4A, wherein the cross-sectional view is obtained from the plane crossing line 4B-4B in FIG. 4A. FIG. 4B illustrates how features 42A are formed, which formation process includes using lithography mask 40 to expose photo resist 44, which is in turn used to pattern features 42A.

Figure 5:
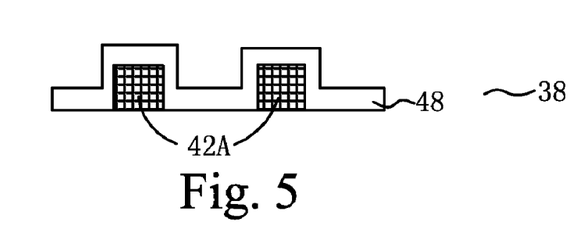
Figure 6C:
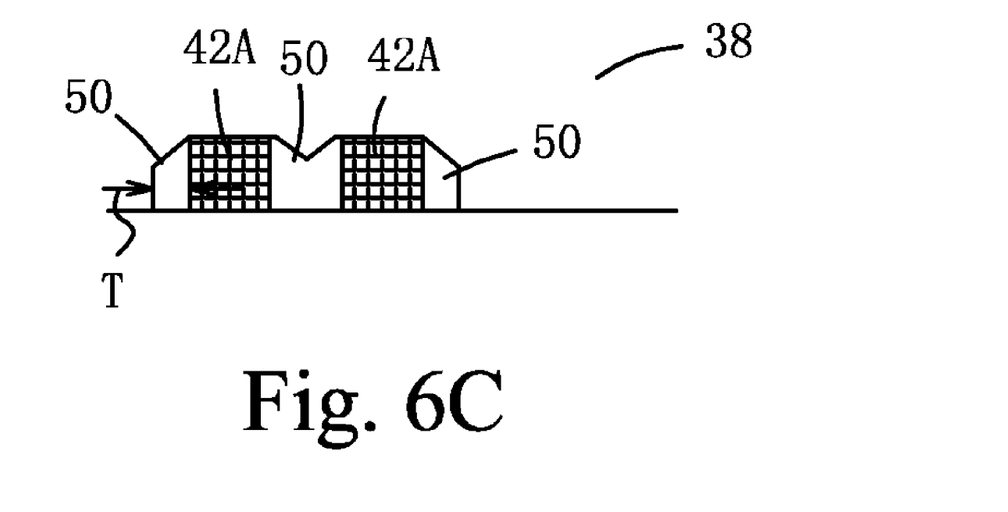

Referring to FIG. 5, spacer layer 48 is formed to cover wafer 38 including features 42A. Spacer layer 48 may be formed of silicon oxide, silicon nitride, silicon oxynitride, combinations thereof, multi-layers thereof, or the like. Next, as shown in FIGS. 6A, 6B, and 6C, an etching step is performed on spacer layer 48 to remove horizontal portions, while vertical portions are left on sidewalls of features 42, forming sidewall spacers 50. FIGS. 6B and 6C illustrate cross-sectional views of the structure shown in FIG. 6A, wherein the cross-sectional views are obtained from the planes crossing lines 6B-6B and 6C-6C, respectively, in FIG. 6A. Referring to FIG. 6A, sidewall spacers 50 that are on the sidewalls of neighboring features 42A may be joined, and encircle spaces 52. It is observed that spaces 52 are at the same locations as, and have similar sizes and shapes as, patterns 26B (including 26B1 and 26B2) as in FIG. 3. FIG. 6B illustrates the formation of space 52 since the spacing between neighboring features 42A is greater than two times thickness T of spacers 50. In FIG. 6C, spacers 50 on neighboring features 42A are joined since the spacing between neighboring features 42A is equal to or less than two times thickness T.

Figure 7A:
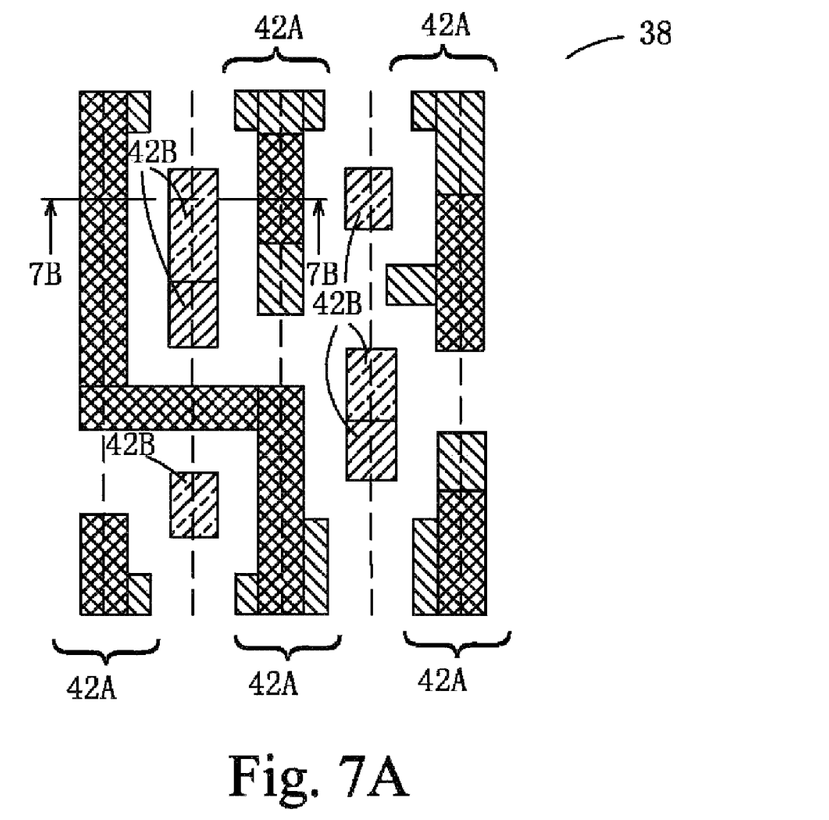
Figure 7B:
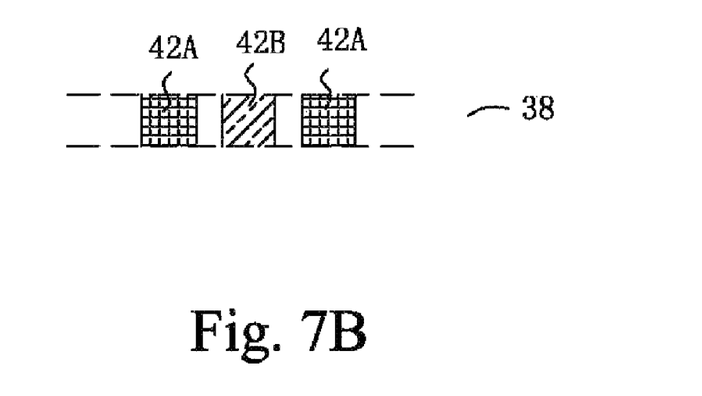

Referring to FIGS. 7A and 7B, which are a top view and a cross-sectional view, respectively, features 42B are formed by filling materials into spaces 52 as shown in FIGS. 6A and 6B. In an embodiment, the material of features 42B may be the same, or similar to, the material of features 42A. In an exemplary embodiment, features 42A and 42B are metal lines including a metal(s). The filling method may include physical vapor deposition (PVD), atomic layer deposition (ALD), or any other application deposition methods, for example, selected from chemical vapor deposition (CVD) methods. A planarization may be performed to level the top surfaces of features 42B to the top surfaces of features 42A. Further, features 42A and 42B are at a same level of the integrated circuits, and their bottom surfaces are substantially level with each other, as shown as a dotted line. In the resulting structure, the patterns of features 42A are essentially the same as patterns 26A (including 26A1, 26A2, and 26A3) in FIG. 3, and the patterns of features 42B are essentially the same as patterns 26B (including 26B1 and 26B2) in FIG. 3.

Figure 8A:
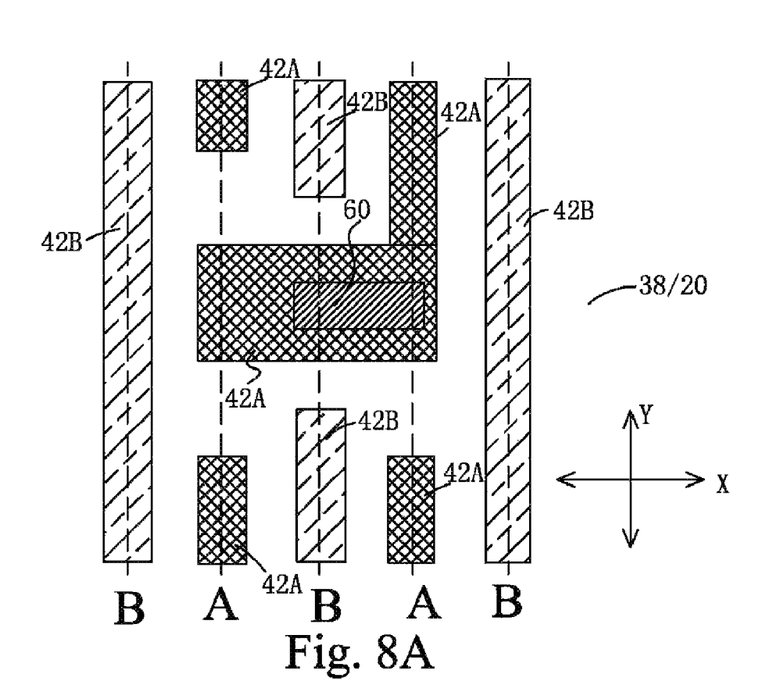
Figure 8B:
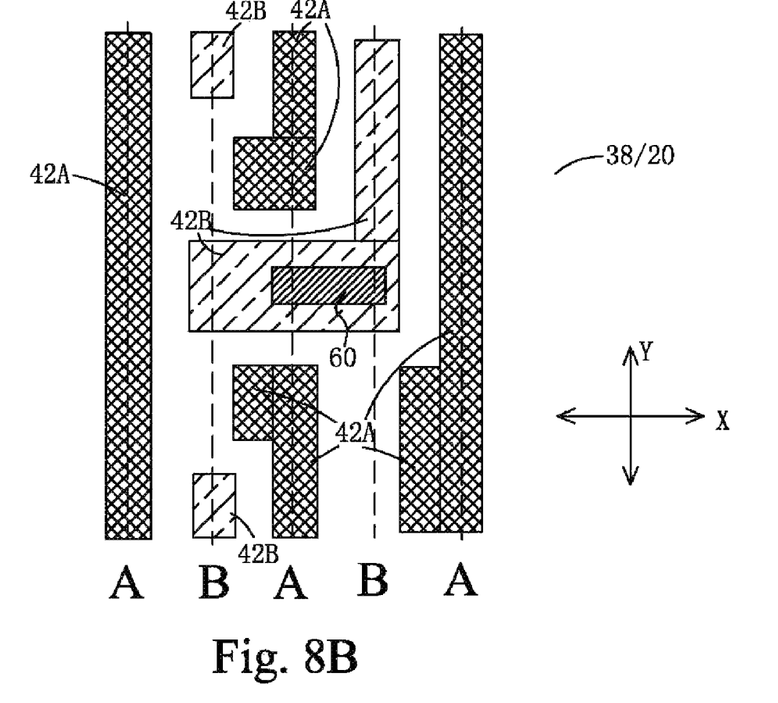
Figure 9:
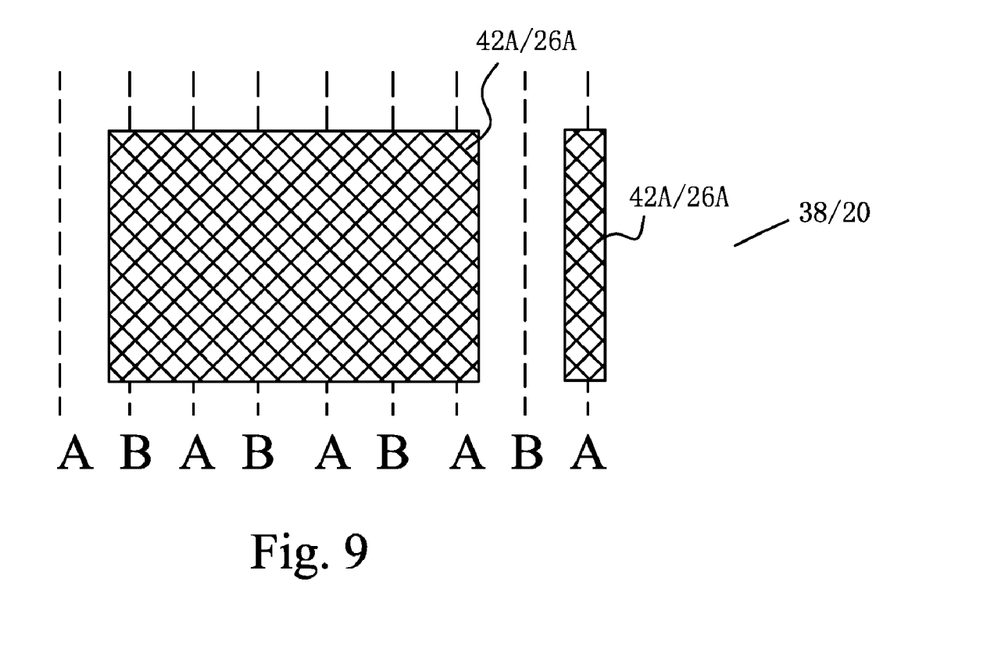
Figure 10:
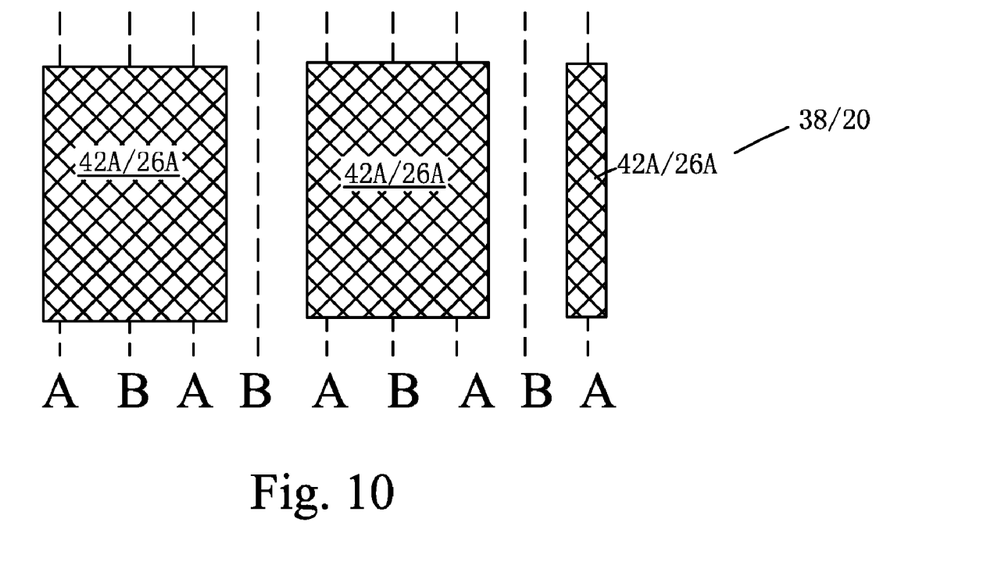

FIGS. 8A and 8B illustrate the shapes of features/patterns 42A/26A and features/patterns 42B/26B in accordance with alternative embodiments. In FIG. 8A, features/patterns 42A/26A may include a jog crossing two A-tracks. Further, a feature/pattern 42A/26A may extend in the Y direction, so that the top-view size of feature/pattern 42A/26A may be greater than the top-view size of via 60, which is over and connected to feature 42A in a cross-sectional view (not shown). Furthermore, in the top view, feature/pattern 42A/26A extends beyond edges of via 60 in X and Y directions, and hence appears to be enclosing via 60 in the top view. FIG. 8B illustrates a similar embodiment, with feature 42B/26B extending beyond edges of via 60 in the top view, and including jog portions crossing two B-tracks. FIGS. 9 and 10 illustrate embodiments wherein each of features 42A/26A (or 42B/26B) extends across multiple A-tracks and/or B-tracks. The formation processes of jogs 42A/26A and 42B/26B may be appreciated from the teaching presented in preceding paragraphs.

Figure 11:
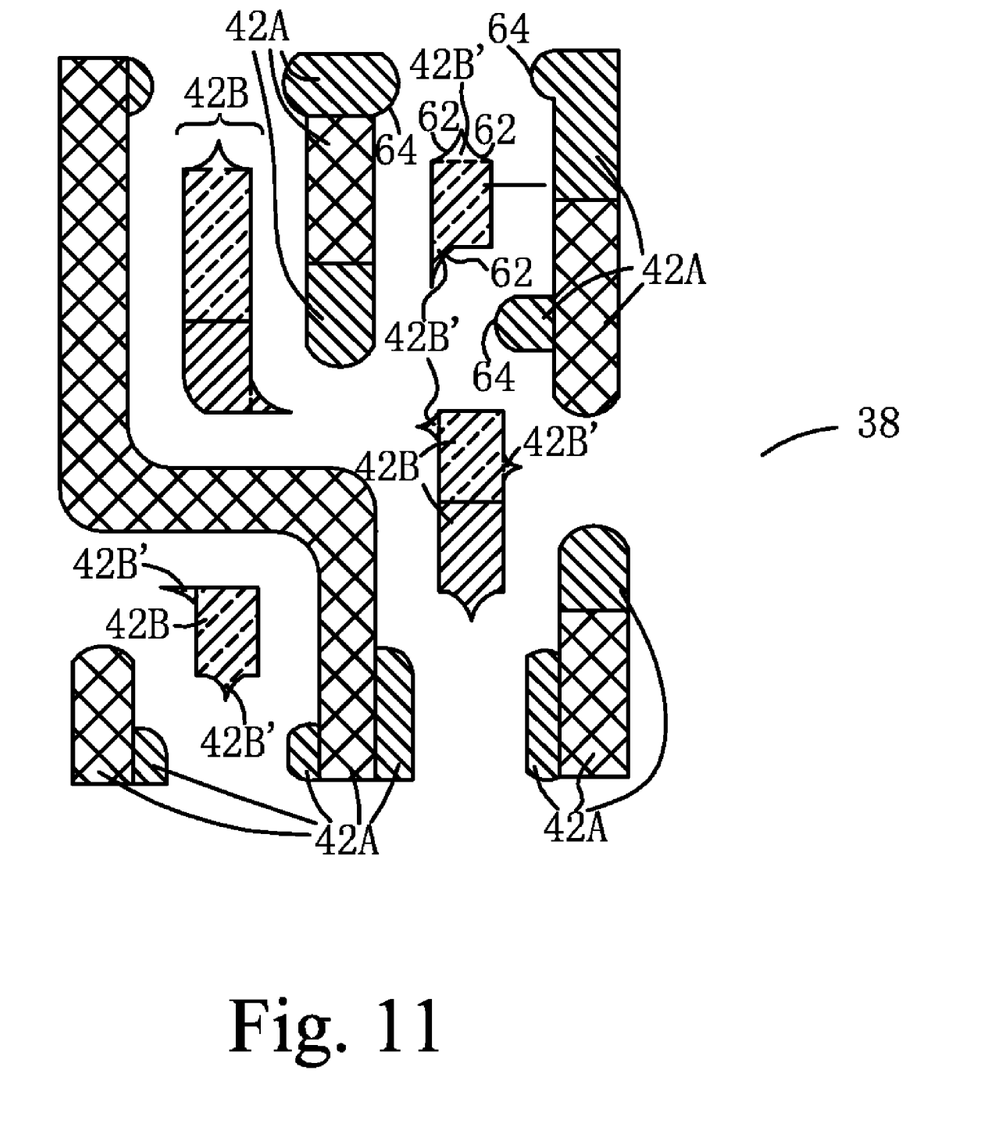
FIG. 11 illustrates a top view of double patterning features formed using the embodiments, wherein spikes are formed.

FIG. 11 illustrates a schematic top view of features 42A and 42B. It is appreciated that patterns 42A may suffer from rounding effects, and in the top view, the corners of features 42A are rounded. As a result, the subsequently formed spacers 50 (not shown in FIG. 11, please refer to FIGS. 6A through 6C) on the sidewalls of the corners will follow the contour of the rounded corners of features 42A. The subsequently formed features 42B will thus have spikes (denoted as 42B'). Spikes 42B' have tips pointing to the spaces between neighboring features 42A, and no tips of spikes 42B' points to non-space portions of features 42A. The profile of sidewalls 62 (viewed in the top view) of spikes 42B' will follow the curves of sidewalls 64 of features 42A that faces sidewalls 62.

Figure 12A:
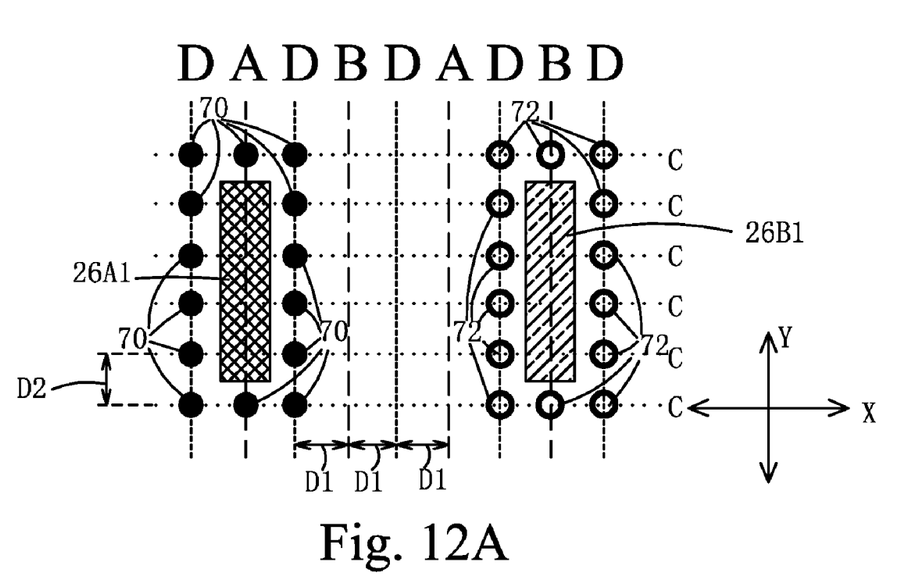

FIGS. 12A through 15 illustrate the layout of double patterning features in accordance with various alternative embodiments. Unless specified otherwise, the reference numerals in these embodiments represent like elements in the embodiments illustrated in FIGS. 1 through 11. In these embodiments, A-pattern half-tracks D are introduced between the A/B-tracks as shown in FIGS. 1 through 10. In initial steps of the embodiments, double patterning features, which are similar to double patterning features 26A1 and 26B1 in FIG. 2, are laid out. A resulting pattern is shown in FIG. 12A. A-pattern half-tracks D are in the middle of A-patterns and neighboring B-patterns. Accordingly, the distance D1 between A-pattern half-tracks D and neighboring A-tracks or B-tracks is a half the distance between an A-track A and a neighboring B-track B. In FIG. 12A, A-tracks, B-tracks, and A-pattern half-tracks D extend in Y direction. In X direction, a plurality of C tracks are also drawn, wherein distance D2 between neighboring C tracks may be equal to, greater than, or smaller than, distance D1.

Figure 12B:
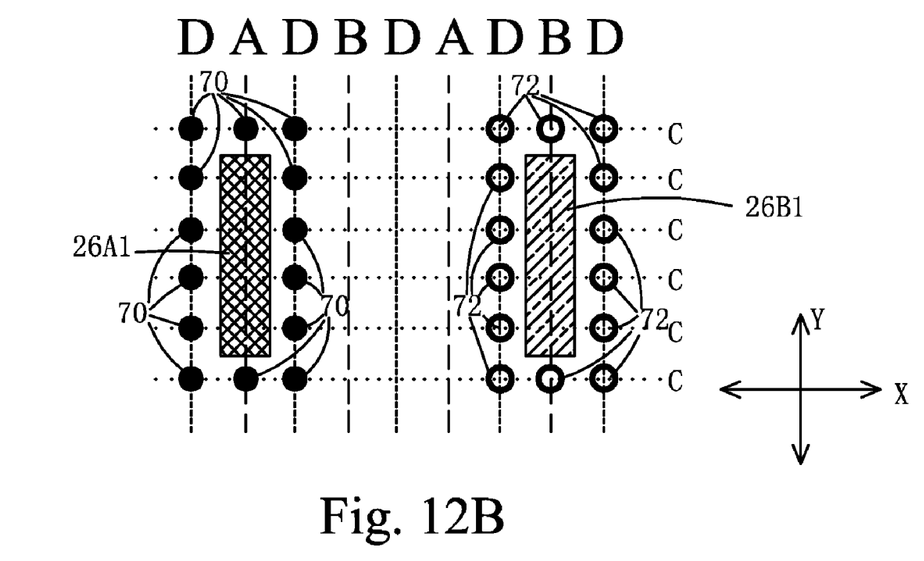

Similar to the embodiments as shown in FIGS. 1 through 11, doubling patterning features are divided into A-patterns (similar to patterns 26A/42A in FIGS. 1 through 11) that are formed using a lithography process, and B-patterns (similar to patterns 26B/42B in FIGS. 1 through 11) that are formed between the spacers encircling the A-patterns. A-patterns 26A1 may be formed on the A-tracks, as shown in FIG. 12A, or be formed on A-pattern half-tracks D, as shown in FIG. 12B. In embodiments, to help enforce design rules, the concept of A-circles and B-circles are used. A-circles 70 are drawn on the grid of C-tracks and A-tracks, B-tracks, and A-pattern half-tracks D, and are arranged to fully encircle A-patterns 26A1. In an embodiment, all grid points immediately neighboring A-pattern 26A1 are occupied by A-circles 70. However, no A-pattern 26A1 is formed on the B-tracks, although routing jogs may be formed to cross B-tracks in order to interconnect two A-patterns 26A1 on different tracks (refer to FIG. 14).

B-patterns 26B1 are formed on the B-tracks, as shown in FIGS. 12A and 12B. B-circles 72 are drawn on the grid of C-tracks and A-tracks, B-tracks, and A-pattern half-tracks D, and are arranged to fully encircle B-patterns 26B1. In an embodiment, all grid points immediately neighboring B-pattern 26B1 are occupied by B-circles 72. No B-patterns 26B1 is formed on A-tracks, although routing jogs may be formed to cross the A-tracks and/or A-pattern half-tracks D in order to interconnect two B-patterns 26B1 on different tracks (refer to FIG. 14).

A-circles 70 and B-circles 72 cannot overlap A-patterns 26A1 and/or B-patterns 26B1. Further, A-circles 70 and B-circles 72 are disposed immediately adjacent the respective A-circles 70 and B-circles 72, and there will be no grid points that are not occupied by A-circles 70 circles existing between A-circles 70 and the respective A-patterns 26A1. Further, there will be no grid points that are not occupied by B-circles 72 existing between B-circles 72 and the respective B-patterns 26B1. In the layout of a wafer or a chip, all of A-patterns 26A1 are fully encircled by A-circles 70, and all of B-patterns 26B1 are fully encircled by B-circles 72.

Figure 13A:
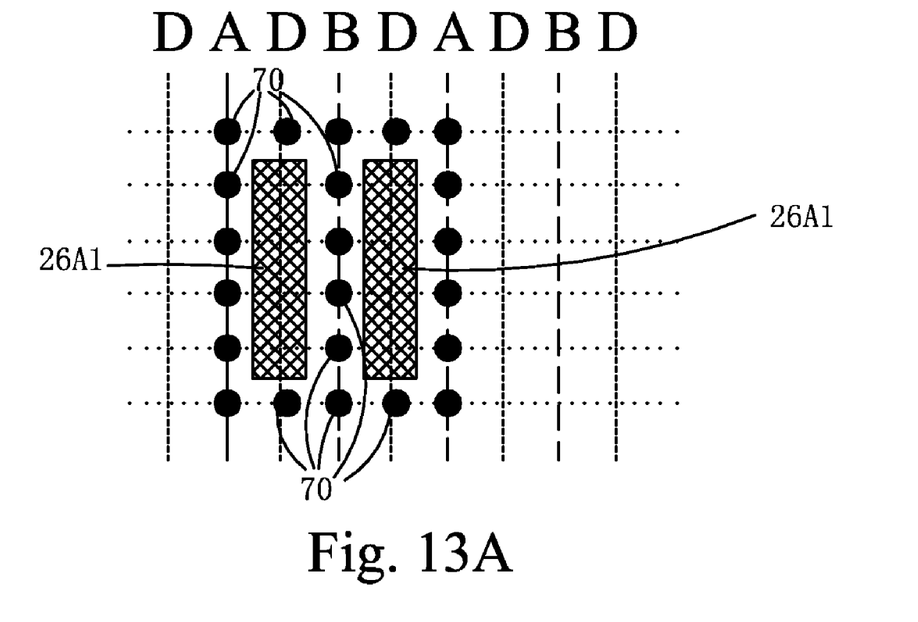
Figure 13B:
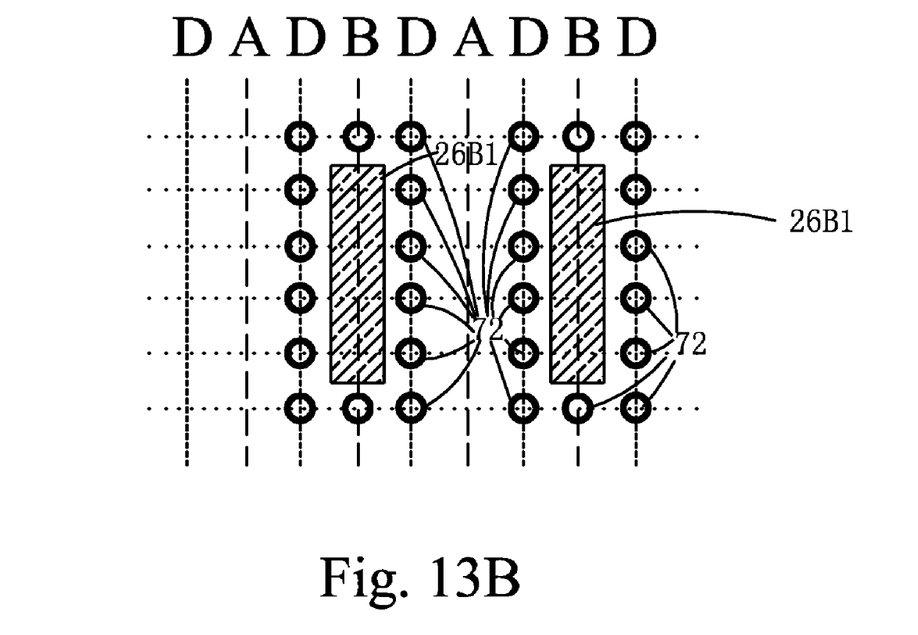
Figure 14:
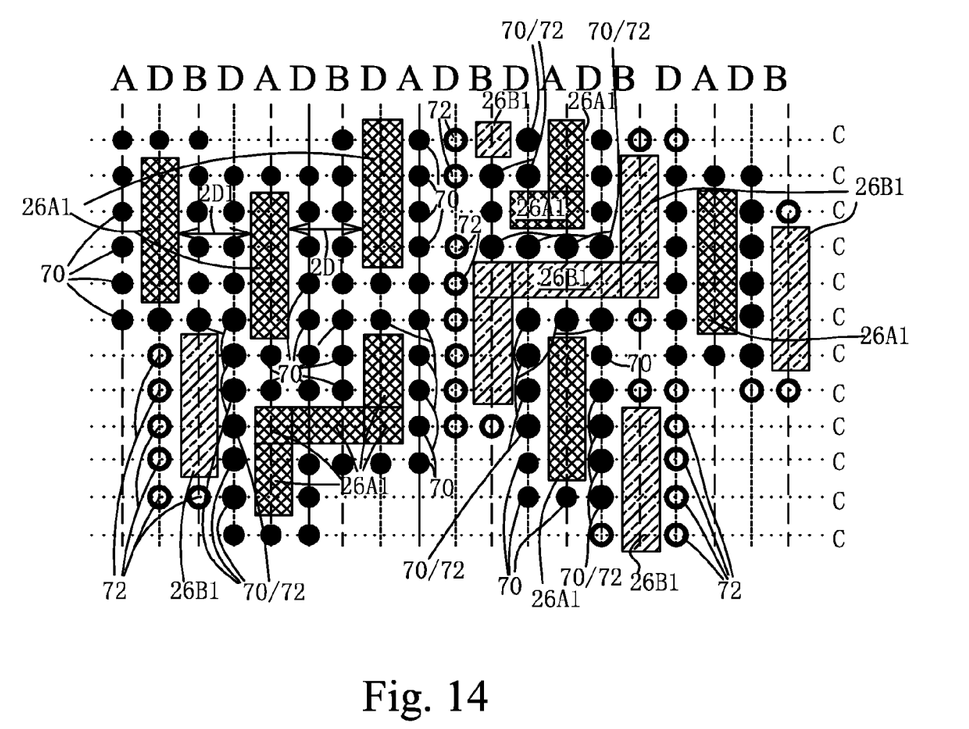

FIGS. 13A and 13B illustrate two layouts that are not allowed by design rules. Referring to FIG. 13A, when two A-patterns 26A1 are placed adjacent to each other with no B-patterns therebetween, the A-circles 72 belonging to different A-patterns 26A1 are not allowed to overlap. Accordingly, neighboring A-patterns 26A1 are spaced apart from each other by at least 2 times of distance D1, as shown in FIG. 14, while the scenario in FIG. 13A is not allowed. A-circles 70, however, can overlap B-circles 72, accordingly, as shown in FIG. 14, the spacing between an A-pattern 26A1 and a neighboring B-pattern 26B1 may be as smaller as one time distance D1.

Referring to FIG. 13B, two B-patterns 26B1 are not allowed to be placed adjacent to each other if there is no A-pattern therebetween. This will ensure that in the subsequent process for forming the respective features 42B (refer to FIG. 11 and FIGS. 4B through 7B), discrete features 42B are not undesirably connected into one. Accordingly, the placement of B-patterns 26B1 in FIG. 13B is not allowed.

FIG. 14 illustrates the formation of the layout of multiple double patterning features 26A1 and 26B1 using the design rules as discussed. The meaning of reference numerals shown in FIG. 14 have been discussed in the embodiments shown in FIGS. 1 through 10, and hence are not repeated herein.

Figure 15:
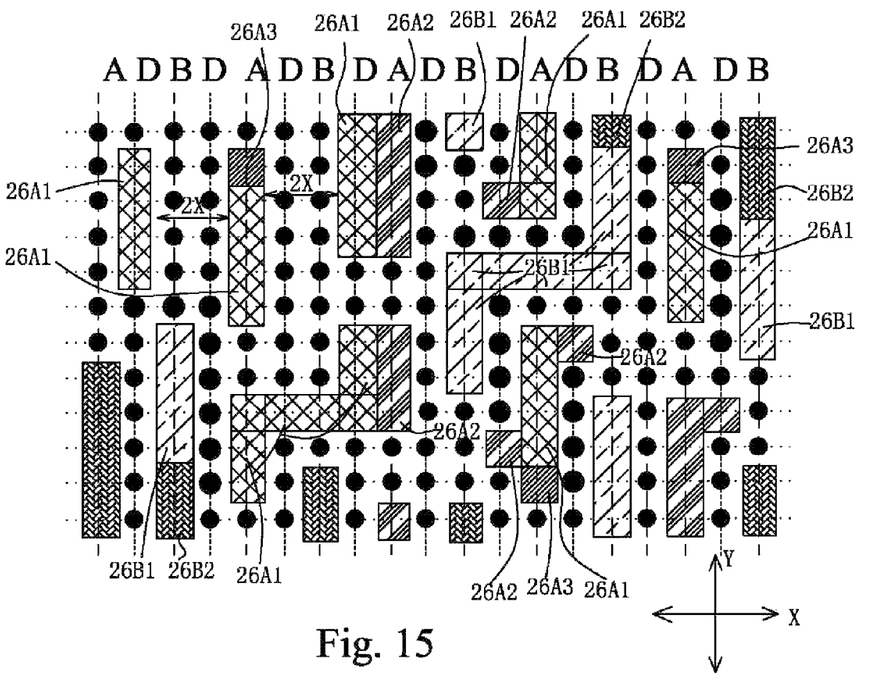

Next, as shown in FIG. 15, patterns 26A1 and 26B1 as in FIG. 14 are extended in X directions and/or Y directions, so that dummy fills 26A2/26A3 and 26B2 are added. Similar to the embodiments shown in FIG. 3, the dummy fills include portions 26A2 that are extended in the x directions, and portions 26A3 and 26B2 that are extended in the Y directions. After the pattern extension, patterns 26A2 and 26A3 may be connected to the respective pattern 26A1 to form integrated patterns (referred to as patterns 26A hereinafter), which, although illustrated using different shadings, are actually not distinguishable from patterns 26A1. Similarly, patterns 26B2 may be connected to the respective pattern 26B1 to form integrated patterns (referred to as patterns 26B hereinafter). In the extension of patterns, dummy fills may overlap A-circles 70 and B-circles 72. It is noted that A-circles 70 and B-circles 72 are virtual circles that are used in the placement of A-patterns 26A1 and B-patterns 26B1, and are no longer used when the dummy fill is performed.

The remaining process steps of these embodiments are essentially the same as shown in FIGS. 4B through 7B. After the pattern as shown in FIG. 15 are laid out, patterns 26A (including 26A1, 26A2, and 26A3) as shown in FIG. 15 may be formed on lithography mask 40 similar to what is shown in FIG. 4B. Next, features 42A are formed using lithography mask 40, as shown in FIGS. 4A through 4B. Spacers are then formed on sidewalls of features 42A, and features 42B are then formed in the spacing encircled by the spacers that encircle features 42A, as shown in FIGS. 5A through 7B.

In the embodiments, only one-photo-one-etch process is needed to form double-patterning patterns 42A, while double-patterning features 42B are formed utilizing double-patterning features 42A, with no second-photo-second-etch process needed. The manufacturing cost is thus reduced. Further, the concern of the misalignment between features 42A and 42B is substantially eliminated.

In accordance with embodiments, a method of forming an integrated circuit structure includes forming a first and a second plurality of tracks parallel to a first direction and on a wafer representation. The first and the second plurality of tracks are allocated in an alternating pattern. A first plurality of patterns is laid out on the first plurality of tracks and not on the second plurality of tracks. A second plurality of patterns is laid out on the second plurality of tracks and not on the first plurality of tracks. The first plurality of patterns is extended in the first direction and in a second direction perpendicular to the first direction, so that each of the second plurality of patterns is surrounded by portions of the first plurality of patterns, and substantially none of neighboring ones of the first plurality of patterns on the wafer representation have spacings greater than a pre-determined spacing.

In accordance with other embodiments, a method of forming an integrated circuit structure comprises providing a wafer; providing a lithography mask; forming a first plurality of features on the wafer using the lithography mask; forming sidewall spacers on sidewalls of the first plurality of features, wherein the sidewall spacers encircle a plurality of spaces; and filling the plurality of spaces to form a second plurality of features.

In accordance with yet other embodiments, a device includes a wafer; a first plurality of features over the wafer; and a second plurality of features at a same level as the first plurality of features, wherein the second plurality of features comprises spikes in a top view of the wafer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit structure, the method comprising:
    providing a wafer representation;
    forming a first and a second plurality of tracks parallel to a first direction and on the wafer representation, wherein the first and the second plurality of tracks are allocated in an alternating pattern;
    laying out a first plurality of patterns on the first plurality of tracks and not on the second plurality of tracks;
    laying out a second plurality of patterns on the second plurality of tracks and not on the first plurality of tracks; and
    extending the first plurality of patterns in the first direction and in a second direction perpendicular to the first direction, so that each of the second plurality of patterns is surrounded by portions of the first plurality of patterns, wherein after the step of extending, substantially none of neighboring ones of the first plurality of patterns on the wafer representation have spacings greater than a pre-determined spacing.

2. The method of claim 1 further comprising transferring the first plurality of patterns to a lithography mask, wherein the second plurality of patterns is not transferred to the lithography mask.

3. The method of claim 1 further comprising:
    forming a third, plurality of tracks parallel to the first direction and on the wafer representation, wherein each of the third plurality of tracks is allocated in the middle of one of the first plurality of tracks and a respective neighboring one of the second plurality of tracks;
    forming a fourth plurality of tracks extending in the second direction and having an even spacing;
    drawing a first plurality of circles encircling each of the first plurality of patterns; and
    drawing a second plurality of circles encircling each of the second plurality of patterns, wherein each of the first and the second plurality of circles is on one of grid points of a grid formed of the first, the second, the third, and the fourth plurality of tracks.

4. The method of claim 3 further comprising laying out a portion of the first plurality of patterns on the third plurality of tracks, wherein a design rule is enforced not to allow the second plurality of patterns to be laid out on the third plurality of tracks.

5. The method of claim 3, wherein a design rule is enforced not to allow any of the first plurality of circles encircling a first one of the first plurality of patterns to overlap any of the first plurality of circles encircling a second one of the first plurality of patterns.

6. The method of claim 1 further comprising:
    providing a wafer; and
    transferring the first plurality of patterns to the wafer to form a first plurality of features using a lithography method, wherein the second plurality of patterns are not transferred.

7. The method of claim 6 further comprising:
    forming sidewall spacers on sidewalls of the first plurality of features; and
    filling spaces encircled by the sidewall spacers to form a second plurality of features, wherein the first and the second plurality of features have substantially leveled top surfaces and substantially leveled bottom surfaces, and are formed of substantially a same material.

8. The method of claim 7, wherein the pre-determined spacing is equal to or less than two times a thickness of the sidewall spacers.

9. The method of claim 1, wherein the steps of laying out the first and the second plurality of patterns and extending the first plurality of patterns are performed by a computer.

10. The method of claim 1 further comprising a step selected from the group consisting essentially of:
    forming a first jog connecting patterns in the first plurality of patterns and on different ones of the first plurality of tracks; and
    forming a second jog connecting patterns in the second plurality of patterns and on different ones of the second plurality of tracks.

* * * * *